US010332949B2

(12) United States Patent
Takeya et al.

(10) Patent No.: US 10,332,949 B2
(45) Date of Patent: Jun. 25, 2019

(54) DISPLAY APPARATUS

(71) Applicant: Seoul Semiconductor Co., Ltd., Ansan-si (KR)

(72) Inventors: Motonobu Takeya, Ansan-si (KR); Jong Ik Lee, Ansan-si (KR); Young Hyun Kim, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 15/642,662

(22) Filed: Jul. 6, 2017

(65) Prior Publication Data

US 2018/0012949 A1   Jan. 11, 2018

Related U.S. Application Data

(60) Provisional application No. 62/358,760, filed on Jul. 6, 2016.

(51) Int. Cl.
| | |
|---|---|
| *H01L 25/16* | (2006.01) |
| *H01L 27/32* | (2006.01) |
| *H01L 51/52* | (2006.01) |

(52) U.S. Cl.
CPC ........ *H01L 27/3262* (2013.01); *H01L 25/167* (2013.01); *H01L 51/5203* (2013.01); *H01L 51/5237* (2013.01); *H01L 2251/5338* (2013.01)

(58) Field of Classification Search
CPC ..................................................... H01L 27/15
See application file for complete search history.

(56) References Cited

U.S. PATENT DOCUMENTS

| | | | | |
|---|---|---|---|---|
| 8,076,680 | B2* | 12/2011 | Lee | F21K 9/00 257/100 |
| 9,048,451 | B2* | 6/2015 | Yokoyama | G02F 1/133555 |
| 9,189,997 | B2* | 11/2015 | Kimura | G02F 1/133603 |
| 9,478,719 | B2* | 10/2016 | West | H01L 33/46 |
| 10,096,647 | B2* | 10/2018 | Takeya | H01L 27/156 |
| 2006/0284532 | A1* | 12/2006 | Kurihara | G02F 1/133617 313/110 |
| 2011/0051043 | A1* | 3/2011 | Kim | G02F 1/133308 349/64 |
| 2011/0285284 | A1* | 11/2011 | Zhou | H01L 25/167 315/32 |
| 2012/0132946 | A1* | 5/2012 | Park | H01L 33/44 257/98 |
| 2013/0126589 | A1 | 5/2013 | Bibl et al. | |
| 2014/0339495 | A1* | 11/2014 | Bibl | H01L 33/504 257/13 |

(Continued)

FOREIGN PATENT DOCUMENTS

JP    2015-500562    1/2015

*Primary Examiner* — Eugene Lee
(74) *Attorney, Agent, or Firm* — H.C. Park & Associates, PLC

(57) ABSTRACT

Disclosed are a display apparatus and a method of manufacturing the same. The display apparatus includes a light emitting part including a plurality of light emitting diodes; and a thin film transistor (TFT) panel part configured to drive the plurality of light emitting diodes. A first side of the light emitting part and a first side of the TFT panel part are coupled to each other so as to face each other. The plurality of light emitting diodes are electrically connected to the plurality of TFTs, respectively.

8 Claims, 9 Drawing Sheets

(56) References Cited

U.S. PATENT DOCUMENTS

| | | | |
|---|---|---|---|
| 2014/0367633 A1* | 12/2014 | Bibl | G02F 1/133603 |
| | | | 257/13 |
| 2016/0240517 A1* | 8/2016 | Kim | H01L 25/0753 |
| 2017/0179192 A1* | 6/2017 | Zhang | H01L 23/29 |
| 2017/0358505 A1* | 12/2017 | Chang | H01L 22/22 |
| 2018/0122786 A1* | 5/2018 | Wu | H01L 27/1248 |

\* cited by examiner

DISPLAY APPARATUS

CROSS-REFERENCE TO RELATED APPLICATION

This patent document claims priority to and the benefit of U.S. Patent Provisional Application No. 62/358,760, filed on Jul. 6, 2016, which is incorporated by reference for all purposes as if fully set forth herein.

BACKGROUND

Field

Exemplary embodiments relate to a display apparatus. More particularly, exemplary embodiments relate to a display apparatus using a micro-light emitting diode or a micro-LED.

Discussion of the Background

A light emitting diode refers to an inorganic semiconductor device that emits light through recombination of electrons and holes. Due to light emitting diodes having remarkably long lifespans, low power consumption, and rapid response rates, light emitting diodes are also highly versatile. In recent years, light emitting diodes have been used in television displays, monitors, automobile lamps, and general lighting. As a result, a light emitting device has many advantages as a light source.

Recently, televisions or monitors generate colorful images with the use of a thin film transistor liquid crystal display (TFT-LCD) panel and light emitting diodes as a backlight source. However, in a TFT-LCD, since one LED is used as a light source for many pixels, a backlight light source must be kept on. As a result, the TFT-LCD suffers from constant power consumption regardless of brightness of a displayed screen.

Also recently, a display apparatus is often manufactured using organic light emitting diodes (OLEDs). Although power consumption of an OLED display apparatus has been continuously reduced, the OLED still requires a much higher power consumption compared to LEDs formed of inorganic semiconductors. Thus, OLED based displays generally have power efficiency less than that of LEDs.

Moreover, a passive-matrix (PM) drive type OLED display apparatus can suffer from deterioration in response speed upon pulse amplitude modulation (PAM) of the OLED having large capacitance. In addition, the PMOLED display apparatus can suffer from deterioration in lifespan upon high current driving through pulse width modulation (PWM) for realizing a low duty ratio.

Furthermore, an active-matrix (AM) driving type OLED display apparatus requires connection of TFTs for each pixel. Thus, the AMOLED display apparatus requires higher manufacturing costs and has non-uniform brightness according to characteristics of TFTs.

SUMMARY

Exemplary embodiments provide a display apparatus using micro-light emitting diodes having low power consumption. These exemplary embodiments may be used in wearable apparatuses, a smartphones, tablet, television, etc.

Exemplary embodiments provide a display apparatus having a large area.

In accordance with one aspect, a display apparatus includes a light emitting part including a plurality of light emitting diodes; and a thin film transistor (TFT) panel part including a plurality of TFTs configured to drive the plurality of light emitting diodes. A first side of the light emitting part and a first side of the TFT panel part are coupled to each other so as to face each other. The light emitting diodes are electrically connected to the TFTs, respectively.

In accordance with another aspect, a display apparatus includes a plurality of light emitting parts each including a plurality of light emitting diodes; and a thin film transistor (TFT) panel part including a plurality of TFTs configured to drive the plurality of light emitting diodes. A first side of the plurality of light emitting parts is coupled to a first side of the TFT panel part so as to face each other and the plurality of light emitting diodes are electrically connected to some of the plurality of TFTs, respectively.

According to exemplary embodiments, the display apparatus employs micro-light emitting diodes formed of nitride semiconductors to realize high resolution, low power consumption, and high efficiency so as to be applicable to a wearable apparatus.

In addition, the display apparatus according to the exemplary embodiments allows light emitted from side surfaces of the light emitting diodes to be discharged through reflection by reflective electrodes, thereby enabling reduction in thickness of the light emitting part.

Further, when the light emitting diodes of the display apparatus according to the exemplary embodiments have a diameter of greater than 10 μm, the display apparatus allows light emitted through upper and side surfaces of the light emitting diodes to be discharged to the outside, thereby improving luminous efficacy.

Further, the display apparatus according to exemplary embodiments allows a plurality of light emitting parts having a plurality of pixels to be mounted on a large TFT panel part such that each of the light emitting parts having confirmed performance can be used in manufacture of a large display apparatus, thereby minimizing failure in manufacture of the display apparatus while improving yield.

BRIEF DESCRIPTION OF DRAWINGS

The accompanying drawings, which are included to provide a further understanding of the disclosed technology, and are incorporated in and constitute a part of this specification, illustrate exemplary embodiments of the disclosed technology, and together with the description serve to describe the principles of the disclosed technology.

DETAILED DESCRIPTION OF THE ILLUSTRATED EMBODIMENTS

Figure 1:
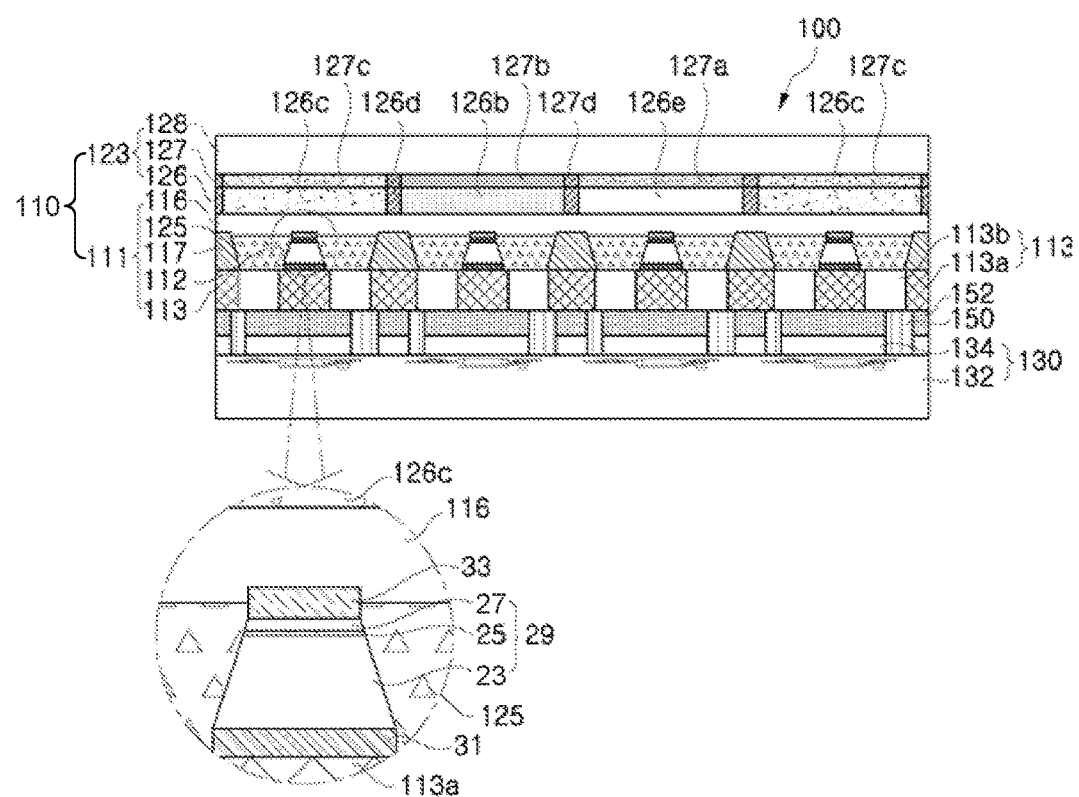
FIG. 1 is a sectional view of a display apparatus according to a first exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein Exemplary embodiments of the present disclosure will be described in more detail with reference to the accompanying drawings.

FIG. 1 is a sectional view of a display apparatus according to a first exemplary embodiment of the present disclosure.

Referring to FIG. 1, the display apparatus 100 according to the first exemplary embodiment includes a light emitting diode part 110, a TFT panel part 130, and an anisotropic conductive film 150.

The light emitting diode part 110 includes a light emitting part 111 and a light conversion part 123. The light emitting part 111 includes light emitting diodes 112, a connection substrate 113, a transparent electrode 116, reflective electrodes 117, and an encapsulation material 125. The light conversion part 123 includes a phosphor layer 126, a color filter 127, and a protective substrate 128.

The light emitting diode part 110 includes a plurality of light emitting diodes 112, which are regularly arranged with reference to the connection substrate 113. For example, the plurality of light emitting diodes 112 may be arranged at constant intervals in rows and columns. In this exemplary embodiment, the plurality of light emitting diodes 112 may include light emitting diodes emitting blue light or UV light.

In the display apparatus 100 according to this exemplary embodiment, the light emitting diode part 110 can be driven by power applied from an exterior power source to each of the light emitting diodes 112. That is, each of the light emitting diodes 112 can be turned on or off in combination and light emitted from each of the light emitting diodes 112 is converted into red light, green light and blue light while passing through the light conversion part 123. Accordingly, the light emitting diode part 110 of the display apparatus 100 can be driven without a separate LCD.

In this exemplary embodiment, a region including a single light emitting diode 112 may be used as a subpixel in the display apparatus 100 and one pixel may be composed of three or four subpixels. In the light emitting diode part, one subpixel may have a larger size than the light emitting diode 112 disposed in the subpixel.

Referring to FIG. 1, each of the light emitting diodes 112 includes an n-type semiconductor layer 23, an active layer 25, a p-type semiconductor layer 27, an n-type electrode 31, and a p-type electrode 33. Here, a light emitting structure 29 including the n-type semiconductor layer 23, the active layer 25 and the p-type semiconductor layer 27 may include Group III-V based compound semiconductors. By way of example, these semiconductor layers may include nitride semiconductors such as (Al, Ga, In)N. In other exemplary embodiments, locations of the n-type semiconductor layer 23 and the p-type semiconductor layer 27 can be interchanged.

The n-type semiconductor layer 23 may include an n-type dopant (for example, Si) and the p-type semiconductor layer 27 may include a p-type dopant (for example, Mg). The active layer 25 is interposed between the n-type semiconductor layer 23 and the p-type semiconductor layer 27. The active layer 25 may have a multi-quantum well (MQW) structure and the composition of the active layer 25 may be determined so as to emit light having a desired peak wavelength.

In this exemplary embodiment, the light emitting structure 29 including the n-type semiconductor layer 23, the active layer 25 and the p-type semiconductor layer 27 may have the shape of a vertical type light emitting diode. In this structure, the n-type electrode 31 may be disposed on an outer surface of the n-type semiconductor layer 23 and the p-type electrode 33 may be disposed on an outer surface of the p-type semiconductor layer 27.

In addition, each of the n-type electrode 31 and the p-type electrode 33 may be formed of an opaque metal. In this exemplary embodiment, the n-type electrode 31 formed of an opaque metal is disposed to cover the entirety of the n-type semiconductor layer 23, whereby light generated in the active layer 25 can be reflected by the n-type electrode 31 to be discharged through a side surface of the n-type semiconductor layer 23 even when passing through the n-type semiconductor layer 23.

Further, the p-type electrode 33 is disposed to cover the entirety of the p-type semiconductor layer 27. Like the n-type electrode 31, the p-type electrode 33 may include an opaque metal, whereby light generated in the active layer 25 can be reflected by the p-type electrode 33 to be discharged through a side surface of the p-type semiconductor layer 27 even when passing through the p-type semiconductor layer 27.

In this exemplary embodiment, the p-type electrode 33 is disposed to cover the entirety of the p-type semiconductor layer 27 and a contact region between the p-type semiconductor layer 27 and the p-type electrode 33 may have a width of 10 µm or less. That is, the contact region between the p-type electrode 33 and the p-type semiconductor layer 27 may have an area of 100 µm$^2$ or less. In this structure wherein the contact area between the p-type electrode 33 and the p-type semiconductor layer 27 is 100 µm$^2$ or less, it is possible to maintain current density of a certain level even when a small amount of current is supplied through the p-type electrode 33.

As described above, in the structure wherein the n-type electrode 31, the insulating layer 37 and the p-type electrode 33 are disposed to cover the entirety of the n-type semiconductor layer 23 and the p-type semiconductor layer 27, light emitted from the active layer 25 can be discharged only through the side surface of the light emitting structure 29 instead of being discharged towards the n-type semiconductor layer 23 or the p-type semiconductor layer 27 (that is, in the vertical direction). Here, the n-type electrode 31 and the p-type electrode 33 may include a metal (for example, Al or Ag) that allows improvement in reflection efficiency while allowing power to be supplied to the light emitting structure 29.

The connection substrate 113 serves to support the light emitting part 111 and may be selected from various substrates. In this exemplary embodiment, the connection substrate 113 may be an insulating substrate that exhibits conductivity at some parts thereof. That is, although most of the connection substrate 113 exhibits insulation properties, some portions of the connection substrate 113 adjoining the light emitting diodes 112 and the reflective electrodes 117 can exhibit conductivity. In this exemplary embodiment, the connection substrate 113 includes conductive portions 113a formed from an upper surface thereof to a lower surface thereof through the connection substrate 113 to allow electrical conduction between the upper surface of the connection substrate 113 and the lower surface thereof. The connection substrate 113 may have a structure in which a plurality of holes is formed through an electrically insulating substrate to extend from an upper surface of the substrate to a lower surface thereof and is filled with a conductive material (for example, Cu). Here, the conductive portions 113a formed in the connection substrate 113 may be electrically insulated from one another by the insulating portions 113b.

In this exemplary embodiment, the connection substrate 113 may be a flexible substrate. Accordingly, the connection substrate 113 can be coupled to a planar TFT panel part 130 or a curved TFT panel part 130. In this exemplary embodiment, the insulating portions 113b of the connection substrate 113 may include polydimethylsiloxane (PDMS), polyimide, ceramic, or a mixture thereof. The conductive portions 113a may include a metal having high electrical conductivity (for example, copper (Cu), gold (Au), or silver (Ag)).

After the connection substrate 113 is formed, the light emitting diodes 112 are disposed on the conductive portions 113a of the connection substrate 113. In this exemplary embodiment, the n-type electrodes 31 of the light emitting diodes 112 contact the conductive portions 113a of the connection substrate 113, without being limited thereto. Alternatively, the p-type electrodes 33 may be disposed to contact the conductive portions 113a of the connection substrate 113, as needed. Further, in the connection substrate 113, the reflective electrodes 117 may electrically contact other conductive portions 113a disposed near the conductive portions 113a contacting the light emitting diodes 112.

Further, in the connection substrate 113, the conductive portions 113a exhibit electrical conductivity, the insulating portions 113b exhibit electrical insulating properties, and both the conductive portions 113a and the insulating portions 113b may include a material capable of reflecting light emitted from the light emitting diodes 112. Accordingly, light emitted from the light emitting diodes 112 can be reflected by the connection substrate 113 towards the reflective electrodes 117 or in an upward direction.

The transparent electrode 116 may electrically contact the p-type electrodes 33 of the light emitting diodes 112 and may also electrically contact the reflective electrodes 117. With this structure, power supplied from the reflective electrodes 117 can be supplied to the p-type electrodes 33. In this exemplary embodiment, the transparent electrode 116 may be transparent to allow light emitted from the light emitting diodes 112 to be directed to the light conversion part 123 therethrough and may be formed as thin as possible. In this exemplary embodiment, the transparent electrode 116 may be formed of ITO.

Each of the reflective electrodes 117 may have a predetermined thickness and be disposed to surround the light emitting diode 112. The reflective electrode 117 is disposed to surround the side surface of the light emitting diode 112. Thus, the size of one subpixel may be determined by the reflective electrode 117.

In this exemplary embodiment, each reflective electrode 117 may be separated from the side surface of the light emitting diode 112 by a predetermined distance and have an inclined side surface facing the light emitting diode 112, as shown in FIG. 1. Here, the inclined surface of the reflective electrode 117 may be sloped in a direction capable of reflecting light emitted from the light emitting diode 112 towards the transparent electrode 116.

Further, as described above, each reflective electrode 117 may have a sidewall formed to set a region for one subpixel and integrated with a sidewall of another subpixel adjacent to the corresponding subpixel. That is, the reflective electrodes 117 may be disposed such that upper portions of the reflective electrodes 117 divide the transparent electrode 116 into a plurality of regions while adjoining to the transparent electrode 116 and lower portions of the reflective electrodes 117 may electrically contact the conductive portions 113a of the connection substrate 113.

Each of the regions divided by the reflective electrodes 117 acts as a subpixel in the display apparatus 100 and each subpixel may be provided with at least one light emitting diode 112.

The encapsulation material 125 may fill the subpixel regions defined by the reflective electrodes 117. With this structure, the encapsulation material 125 may be disposed to cover the entirety of the light emitting diodes 112 and may be formed of a transparent material that exhibits electrical insulating properties. Accordingly, light emitted from the light emitting diodes 112 can be discharged through the encapsulation material 125.

As described above, the light conversion part 123 includes the phosphor layer 126, the color filter 127, and the protective substrate 128.

The phosphor layer 126 may be disposed on the protective substrate 128 and may include a green phosphor layer 126b, a red phosphor layer 126c, and a transparent layer 126e. The green phosphor layer 126b, the red phosphor layer 126c and the transparent layer 126e are alternately arranged to be adjacent to each other and separated from each other by a predetermined distance or more. In addition, a blocking layer 126d may be disposed between the green phosphor layer 126b, the red phosphor layer 126c, and the transparent layer 126e. Accordingly, the blocking layer 126d can prevent mixture of light by preventing light having entered the green phosphor layer 126b, the red phosphor layer 126c, or the transparent layer 126e from entering other phosphor layers.

Although the blue light emitting diodes are illustrated as the light emitting diodes 112 in this exemplary embodiment, the light emitting diodes 112 may emit light having a peak wavelength (for example, 360 nm to 470 nm) in the blue light range or in the near UV range.

Accordingly, the green phosphor layer 126b emits green light through wavelength conversion of blue light emitted from the light emitting diodes 112 and the red phosphor layer 126c emits red light through wavelength conversion of blue light emitted from the light emitting diodes 112. The transparent layer 126e allows blue light emitted from blue light emitting diode to be discharged therethrough without wavelength conversion.

In the structure wherein the light emitting diodes 112 are UV light emitting diodes, a blue phosphor layer may be disposed at the location of the transparent layer 126e instead of the transparent layer 126e. In this structure, UV light emitted from the light emitting diodes 112 is converted into blue light while passing through the blue phosphor layer such that blue light can be discharged to the outside.

In this exemplary embodiment, the color filter 127 may be interposed between the phosphor layer 126 and the protective substrate 128. The color filter 127 may include a blue light portion 127a, a green light portion 127b, a red light portion 127c, and a light blocking portion 127d. The color filter 127 may be formed in a film shape and can block light having passed through the color filter 127 excluding light of a certain wavelength.

That is, the blue light portion 127a allows only blue light to pass therethrough by blocking light having other wavelengths excluding the wavelength of blue light, and the green light portion 127b allows only green light to pass therethrough by blocking light having other wavelengths excluding the wavelength of green light. The red light portion 127c allows only red light to pass therethrough by blocking light having other wavelengths excluding the wavelength of red light. The light blocking portion 127d is disposed between the blue light portion 127a, the green light portion 127b and the red light portion 127c, and blocks all wavelengths of light.

The blue light portion 127a of the color filter 127 is disposed on the transparent layer 126e of the phosphor layer 126 and the green light portion 127b of the color filter 12 is disposed on the green phosphor layer 126b of the phosphor layer 126. In addition, the red light portion 127c of the color filter 12 is disposed on the red phosphor layer 126c of the phosphor layer 126. Accordingly, light emitted from the light emitting diodes 112 is subjected to wavelength conversion while passing through the phosphor layer 126, whereby blue light, green light and red light can be separately discharged to the outside through the color filter 127. By way of example, although blue light emitted from the light emitting diodes 112 is converted into green light through the green phosphor layer 126b, some fraction of the blue light can pass through the phosphor layer 126 without wavelength conversion. The blue light having passed through the phosphor layer 126 without wavelength conversion is blocked by the green light portion 127b of the color filter 127 such that only green light can be discharged through the green light portion 127b of the color filter 127.

The protective substrate 128 is disposed to contact the color filter 127 and can protect the color filter 127 from the outside by preventing the color filter 127 from being directly exposed. In this exemplary embodiment, the protective substrate 128 may be formed of a transparent material through which light can pass.

The TFT panel part 130 is coupled to the light emitting part 111 and serves to supply power to the light emitting part 111. To this end, the TFT panel part 130 includes a panel substrate 132 and connection electrodes 134. The TFT panel part 130 can control power supply to the light emitting diode part 110 to allow only some of the light emitting diodes 112 in the light emitting diode part 110 to emit light and can control the intensity of light emitted from the light emitting diodes 112.

The panel substrate 132 may have a TFT drive circuit therein. The TFT drive circuit may be a circuit for driving an active matrix (AM) or a circuit for driving a passive matrix (PM).

The connection electrodes 134 are electrically connected to the TFT drive circuit of the panel substrate 132 and to the light emitting diodes 112 or the reflective electrodes 117 of the light emitting diode part 110. That is, multiple connection electrodes 134 may be provided and they may be separated from each other. Power supplied through the TFT drive circuit can be supplied to each of the light emitting diodes 112 through the connection electrodes 134 and the reflective electrodes 117. In this exemplary embodiment, the connection electrodes 134 may be covered by a separate protective layer, which may include, for example, $SiN_x$.

The anisotropic conductive film 150 serves to electrically connect the light emitting diode part 110 to the TFT panel part 130. The anisotropic conductive film 150 may include an adhesive organic insulating material and may contain conductive particles uniformly dispersed therein to achieve electrical connection. The anisotropic conductive film 150 exhibits electrical conductivity in the thickness direction thereof and insulating properties in the plane direction thereof. In addition, the anisotropic conductive film 150 exhibits adhesive properties. With this structure, the anisotropic conductive film 150 can bond the light emitting part 111 to the TFT panel part 130 such that the light emitting part 111 can be electrically connected to the TFT panel part 130 therethrough.

Particularly, the anisotropic conductive film 150 may be advantageously used to connect ITO electrodes which are difficult to solder at high temperature.

As such, in the structure wherein the light emitting part 111 is coupled to the TFT panel part 130 via the anisotropic conductive film 150, the connection substrate 113 can be electrically connected to the connection electrodes 134 of the TFT panel part 130 via an electrode connection portion 152.

In this exemplary embodiment, the light emitting part 111 and the TFT panel part 130 may be individually manufactured and a process of coupling the light emitting part 111 to the TFT panel part 130 will be described below.

FIG. 2A, FIG. 2B, FIG. 2C, FIG. 2D, FIG. 2E, and FIG. 2F are sectional views illustrating a process of manufacturing light emitting diodes of the display apparatus according to the first exemplary embodiment.

Referring to FIGS. 2A-2F, the process of manufacturing the plurality of light emitting diodes 112 will be described.

Figure 2A:
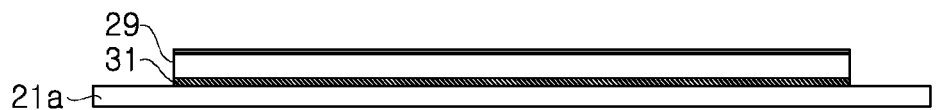
FIG. 2A, FIG. 2B, FIG. 2C, FIG. 2D, FIG. 2E, and FIG. 2F are sectional views illustrating a process of manufacturing light emitting diodes of the display apparatus according to the first exemplary embodiment.

Referring to FIG. 2A, an n-type electrode 31 having a predetermined area is disposed on a first manufacturing substrate 21a, and an n-type semiconductor layer 23, an active layer 25 and a p-type semiconductor layer 27 are sequentially stacked on the n-type electrode 31. The first manufacturing substrate 21a may be a sapphire substrate, a gallium nitride substrate, a glass substrate, a silicon carbide substrate, a silicon substrate, a metal substrate, a ceramic substrate, or the like.

Figure 2B:
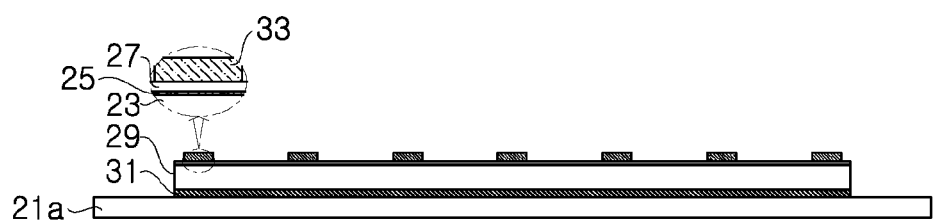

Referring to FIG. 2B, a plurality of p-type electrodes 33 is disposed on the p-type semiconductor layer 27. In this exemplary embodiment, the p-type electrodes 33 may be separated from each other by a predetermined distance.

Figure 2C:
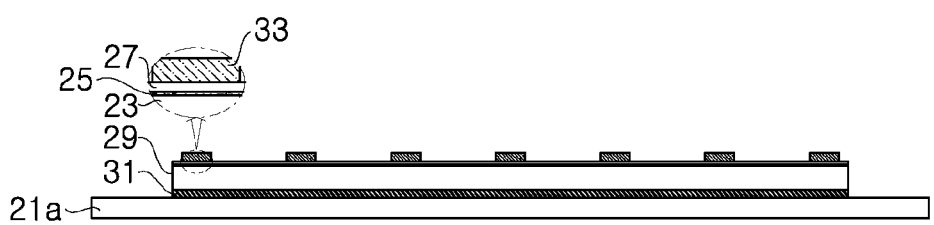

After formation of the p-type electrodes 33, the p-type semiconductor layer 27, the active layer 25, the n-type semiconductor layer 23 and the n-type electrode 31 are etched with respect to each of the p-type electrodes 33. As a result, a plurality of light emitting diodes 112 can be formed on the first manufacturing substrate 21a, as shown in FIG. 2C. In this exemplary embodiment, each of the light emitting diodes 112 may include a trapezoidal light emitting structure 29.

Figure 2D:
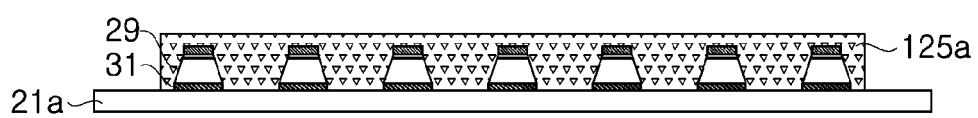
Figure 2E:
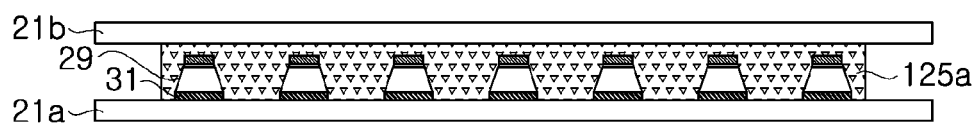
Figure 2F:
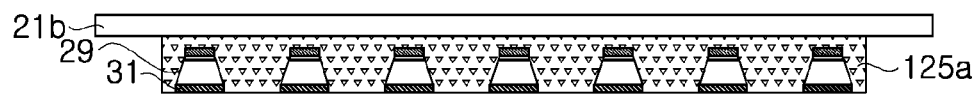

In order to transfer the plurality of light emitting diodes 112 to the connection substrate 113, the plurality of light emitting diodes 112 is covered with a filler 125a, as shown in FIG. 2D. Then, referring to FIG. 2E, a second manufacturing substrate 21b is bonded to an upper side of the filler 125a. The second manufacturing substrate 21b may be the same substrate as the first manufacturing substrate 21a or may be a different substrate than the first manufacturing substrate, as needed. After the second manufacturing substrate 21b is coupled to the upper side of the filler 125a, the first manufacturing substrate 21a is removed, as shown in FIG. 2F.

FIG. 3A, FIG. 3B, FIG. 3C, FIG. 3D, FIG. 3E, FIG. 3F, and FIG. 3G are sectional views illustrating a process of manufacturing the light emitting diode part of the display apparatus according to the first exemplary embodiment.

Figure 3A:
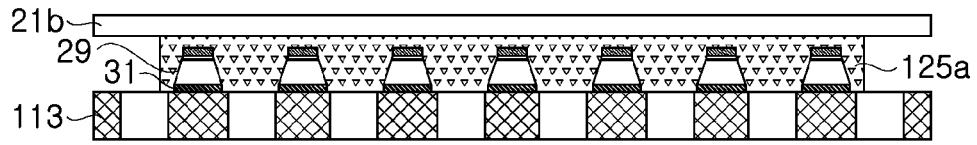
FIG. 3A, FIG. 3B, FIG. 3C, FIG. 3D, FIG. 3E, FIG. 3F, and FIG. 3G are sectional views illustrating a process of manufacturing a light emitting part of the display apparatus according to the first exemplary embodiment.

The light emitting part 111 may be manufactured using the plurality of light emitting diodes 112 manufactured by the process shown in FIGS. 2A-2F. As shown in FIG. 3A, the connection substrate 113 is brought into contact with the plurality of light emitting diodes 112 attached to the second manufacturing substrate 21b. Here, a bonding agent may be applied to part of an upper surface of the connection substrate 113. The bonding agent may be applied to some of the conductive portions 113a of the connection substrate 113. As a result, among the plurality of light emitting diodes 112, only the light emitting diodes 112 contacting the bonding agent can be coupled to the connection substrate 113.

Figure 3B:
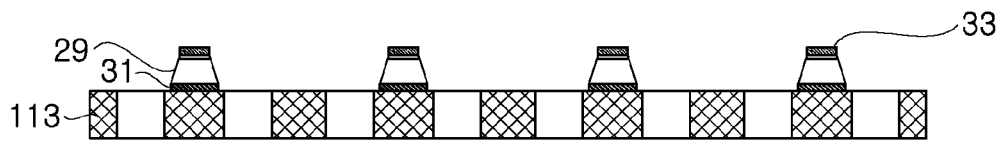

FIG. 3B shows the plurality of light emitting diodes 112 coupled to the connection substrate 113. That is, in this exemplary embodiment, the plurality of light emitting diodes 112 may be coupled to the connection substrate 113 such that one light emitting diode is provided to one sub-pixel.

Figure 3C:
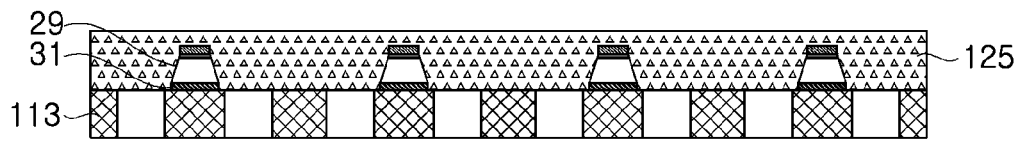

After the plurality of light emitting diodes 112 is coupled to the connection substrate 113, an encapsulation material 125 may be formed to cover each of the light emitting diodes 112 and the connection electrodes 134. The encapsulation material 125 may be formed of an electrically insulating material and may be transparent. FIG. 3C shows the encapsulation material 125 formed to cover each of the light emitting diodes 112.

Figure 3D:
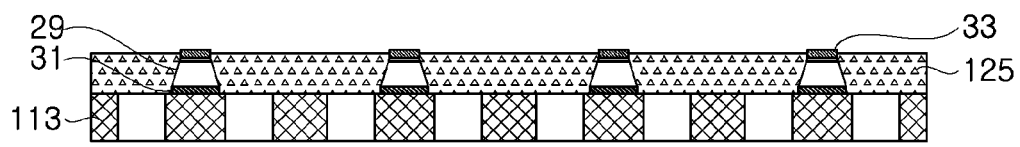

Next, referring to FIG. 3D, the encapsulation material 125 is subjected to etching to expose upper surfaces of the p-type electrodes 33. Etching of the encapsulation material 125 may be performed to expose only part of the upper surfaces of the p-type electrodes 33 without exposing the p-type semiconductor layer 27.

Figure 3E:
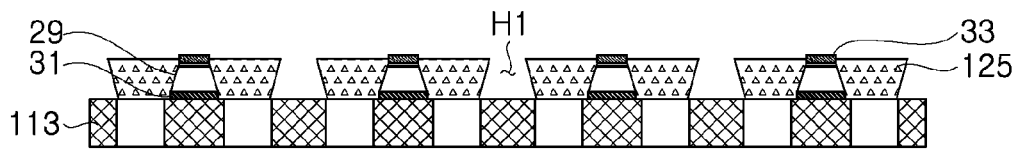

Then, referring to FIG. 3E, with reference to the exposed regions of the p-type electrodes 33, each region between the light emitting diodes 112 is subjected to etching to form a first blind-hole H1. The shape of the subpixel may be determined by the first blind-hole H1. That is, since the encapsulation material 125 is etched such that an inner side surface of the first blind-hole H becomes an inclined surface, a plurality of mesas may be formed on the connection electrodes 134. In this exemplary embodiment, one mesa may receive at least one light emitting diode 112 therein and the encapsulation material 125 may be configured to surround at least one light emitting diode 112.

Figure 3F:
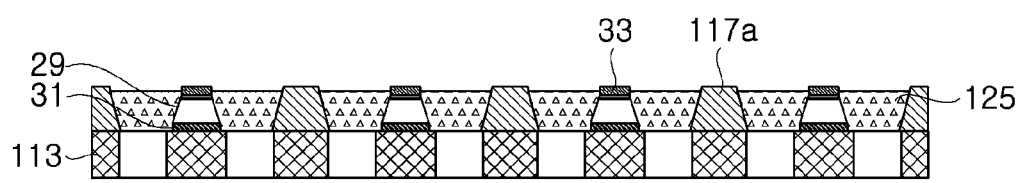

After the first blind-holes H1 are formed as described above, reflective electrodes 117 are formed to fill the first blind-holes H1, as shown in FIG. 3F. Each of the reflective electrodes 117 may be formed in the first blind-hole H1 so as to correspond to the shape of the first blind-hole such that the reflective electrode 117 can have an inclined side surface corresponding to the shape of the side surface of the first blind-hole H1. The reflective electrodes 117 may have the same height as a distance from the connection substrate 113 to an upper surface of the p-type electrode 33.

Figure 3G:
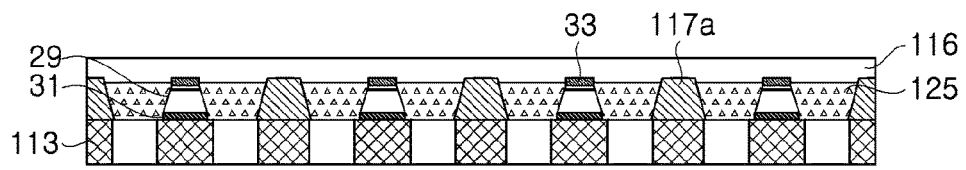

Then, as shown in FIG. 3G, a transparent electrode 116 is formed to cover the p-type electrodes 33, the encapsulation material 125 and the reflective electrodes 117. The transparent electrode 116 may be formed by filling steps between the p-type electrodes 33, the encapsulation material 125 and the reflective electrodes 117.

As the transparent electrode 116 is formed as described above, manufacture of the light emitting diode part 110 according to this exemplary embodiment is completed.

Figure 4A:
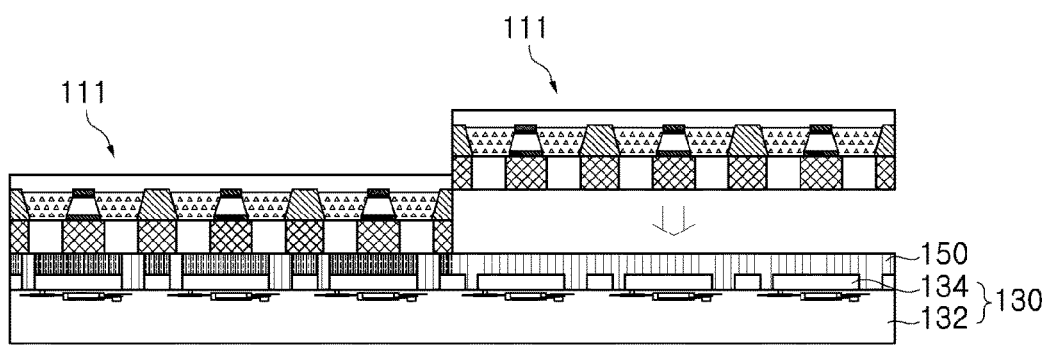
FIG. 4A, FIG. 4B, and FIG. 4C are sectional views illustrating a process of coupling the light emitting part, a light conversion part and a TFT panel part of the display apparatus according to the first exemplary embodiment.
Figure 4B:
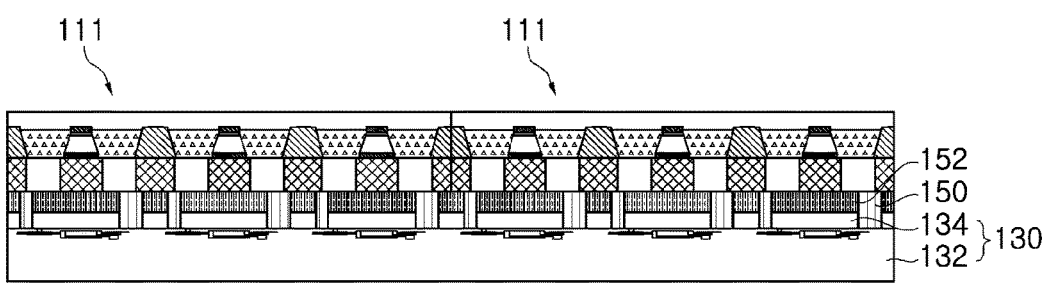
Figure 4C:
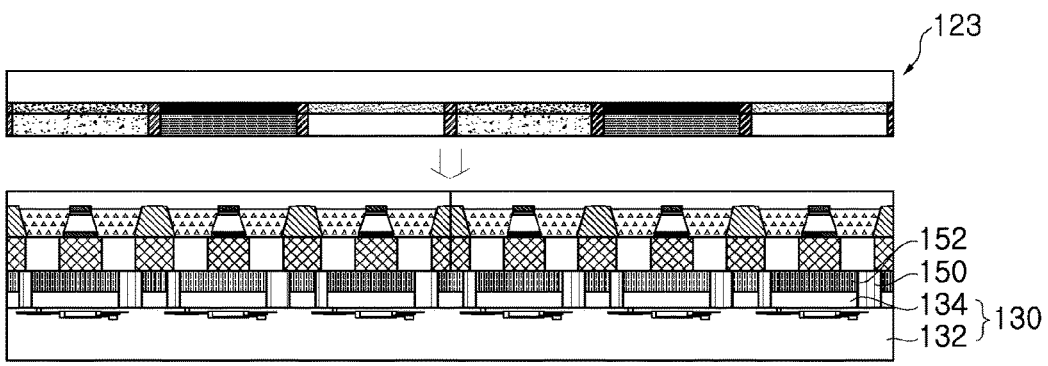

FIG. 4A, FIG. 4B, and FIG. 4C are sectional views illustrating a process of coupling the light emitting part, the light conversion part, and the TFT panel part of the display apparatus according to the first exemplary embodiment.

After completion of manufacture of the light emitting part 111 through the processes shown in FIGS. 2A-2F and FIGS. 3A-3G, the light emitting part 111 may be coupled to the light conversion part 123 and the TFT panel part 130, which are separately manufactured. This process will be described with reference to FIGS. 4A-4C.

The TFT panel part 130 may be manufactured to have a large area and may be provided with a connection electrode 134 and a TFT circuit at a location corresponding to each subpixel. Thus, as shown in FIG. 4A, the light emitting part 111 having a smaller size than the TFT panel part 130 having a large area is coupled to the TFT panel part 130. In this exemplary embodiment, the TFT panel part 130 has an anisotropic conductive film 150 attached to an upper side thereof and the light emitting part 111 is disposed on the anisotropic conductive film 150 such that the conductive portions 113a of the connection substrate 113 adjoin the connection electrodes 134, respectively. In addition, the light emitting part 111 is coupled to the TFT panel part 130 by imparting force from above the light emitting part 111 towards the TFT panel part 130. Here, the anisotropic conductive film 150 is compressed such that the conductive portions 113a of the connection substrate 113 can be electrically connected to the connection electrodes 134.

After one light emitting part 111 is coupled to the TFT panel part 130 having a large area, another light emitting part 111 is coupled to the TFT panel part 130 so as to be adjacent to the light emitting part 111 coupled to the TFT panel part 130. As a result, the light emitting parts 111 are coupled to the TFT panel part 130, as shown in FIG. 4B.

After completion of coupling a plurality of light emitting parts 111 to the TFT panel part 130, the light conversion part 123 is coupled to upper sides of the light emitting parts 111, as shown in FIG. 4C. Here, the light conversion part 123 is coupled thereto such that the phosphor layer 126 contacts the transparent electrode 116. In this exemplary embodiment, the light conversion part 123 may also be manufactured to have a large area like the TFT panel part 130.

As such, the light conversion part 123 having a large area is coupled to the plurality of light emitting parts 111, thereby providing a finished display apparatus 100.

Figure 5:
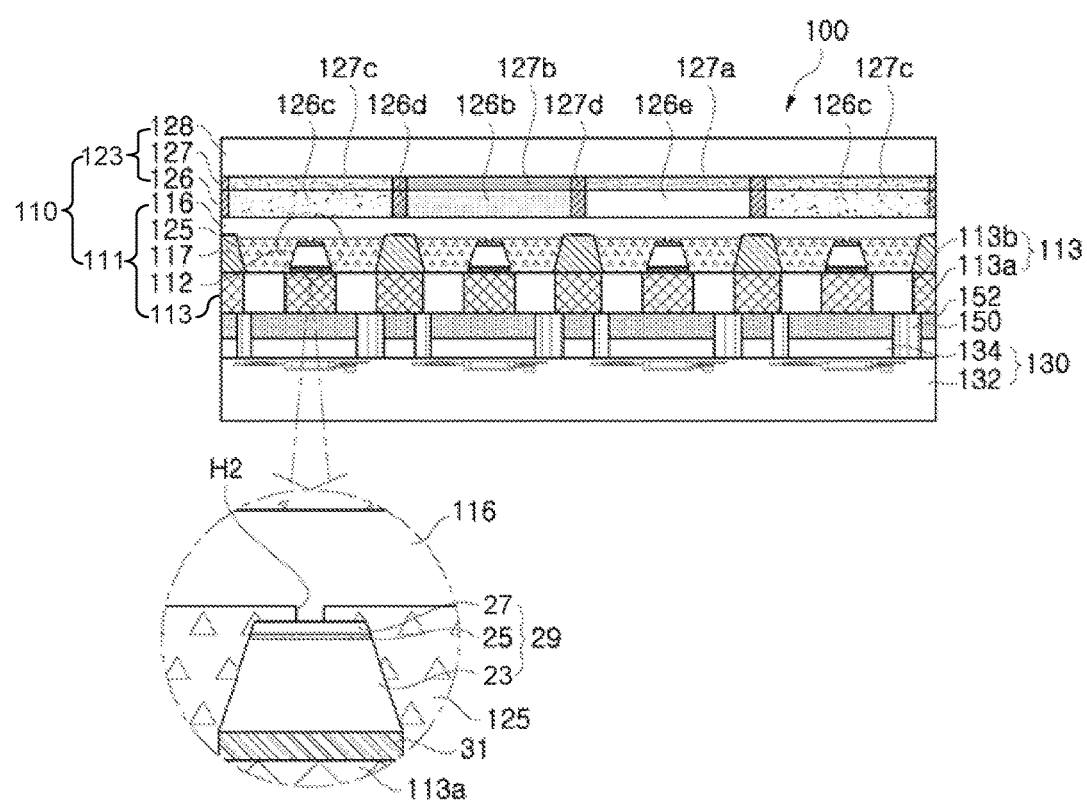
FIG. 5 is a sectional view of a display apparatus according to a second exemplary embodiment.

FIG. 5 is a sectional view of a display apparatus according to a second exemplary embodiment.

Referring to FIG. 5, the display apparatus 100 according to the second exemplary embodiment includes a light emitting diode part 110, a TFT panel part 130, and an anisotropic conductive film 150.

The light emitting diode part 110 includes a light emitting part 111 and a light conversion part 123. The light emitting part 111 includes light emitting diodes 112, a connection substrate 113, a transparent electrode 116, reflective electrodes 117, and an encapsulation material 125. The light conversion part 123 includes a phosphor layer 126, a color filter 127, and a protective substrate 128. In description of the second exemplary embodiment, descriptions of the same components as the first exemplary embodiment will be omitted.

In this exemplary embodiment, the light emitting part 111 includes a plurality of light emitting diodes 112, each of which includes an n-type semiconductor layer 23, an active layer 25, a p-type semiconductor layer 27, and an n-type electrode 31. Unlike the first exemplary embodiment, the light emitting diode 112 according to this exemplary embodiment does not include the p-type electrode 33. As described below, the p-type semiconductor layer 27 of the light emitting diode 112 according to this exemplary embodiment may have a width of greater than 10 µm. That is, an upper surface of the p-type semiconductor layer 27 may have an area of larger than 100 µm$^2$. However, it should be noted that the size of the light emitting diode 112 does not increase without limitation and may be determined so as to be received in a subpixel.

In this exemplary embodiment, each of the light emitting diodes 112 is surrounded by the encapsulation material 125 and the upper side of the light emitting diode 112 may also be covered by the encapsulation material 125. Here, the upper side of the light emitting diode 112 may be partially covered by the encapsulation material 125 such that an upper side of the p-type semiconductor layer 27 can be partially exposed. An exposed area of the p-type semiconductor layer 27 may be small, as compared with the overall area of the p-type semiconductor layer 27. By way of example, when the p-type semiconductor layer 27 has a total area of 100 µm$^2$, the exposed region of the p-type semiconductor layer 27 may have an area of larger than 0.1 µm$^2$ to 25 µm$^2$.

The transparent electrode 116 is disposed to cover the reflective electrodes 117 and the encapsulation material 125 and may electrically contact the p-type semiconductor layer 27 exposed through the encapsulation material 125. With this structure, even when small current is supplied to the p-type semiconductor layer 27, it is possible to maintain current density of a certain level or more since the contact area between the p-type semiconductor layer 27 and the transparent electrode 116 is relatively small.

With this structure of the light emitting diode 112, light emitted from the light emitting diodes 112 can be discharged through the upper and side surfaces of the light emitting diodes 112. Light emitted from the side surfaces of the light emitting diode 112 is reflected by the connection substrate 113 and the reflective electrodes 117 to be discharged upwards.

FIG. 6A, FIG. 6B, FIG. 6C, FIG. 6D, FIG. 6E, FIG. 6F, and FIG. 6G are sectional views illustrating a process of manufacturing the light emitting diodes of the display apparatus according to the second exemplary embodiment. FIG. 7A, FIG. 7B, FIG. 7C, FIG. 7D, FIG. 7E, and FIG. 7F are sectional views illustrating a process of manufacturing the light emitting part of the display apparatus according to the second exemplary embodiment.

Figure 6A:
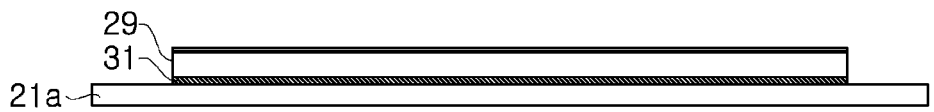
FIG. 6A, FIG. 6B, FIG. 6C, FIG. 6D, FIG. 6E, FIG. 6F, and FIG. 6G are sectional views illustrating a process of manufacturing light emitting diodes of the display apparatus according to the second exemplary embodiment.
Figure 6B:
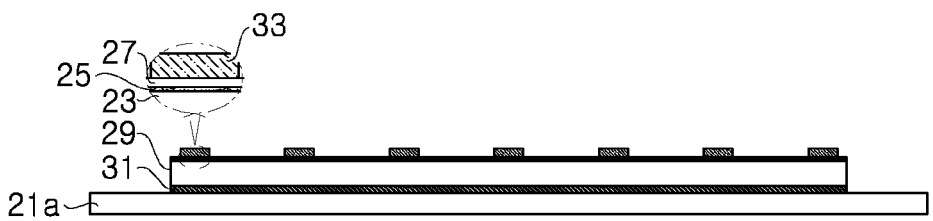
Figure 6C:
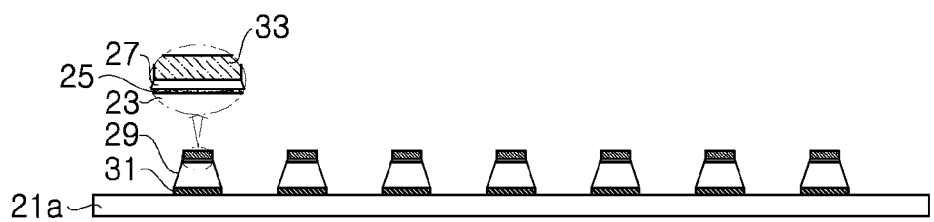
Figure 6D:
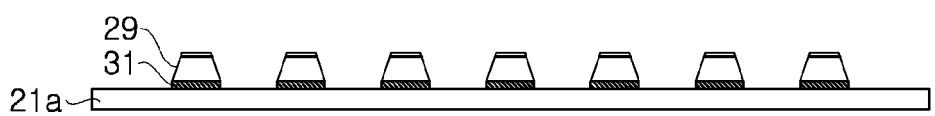

The process of manufacturing the light emitting diodes 112 according to this exemplary embodiment will be described with reference to FIGS. 6A-6G. The process shown in FIGS. 6A, 6B, and 6C is the same as that of the first exemplary embodiment and a description thereof will be omitted. Referring to FIG. 6C, after the plurality of light emitting diodes 112 is formed with reference to the p-type electrodes 33, the p-type electrodes 33 are removed from the plurality of light emitting diodes 112. FIG. 6D shows the structure wherein the p-type electrodes 33 are removed from the light emitting diodes 112.

Figure 6E:
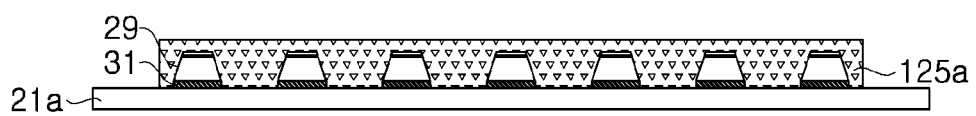
Figure 6F:
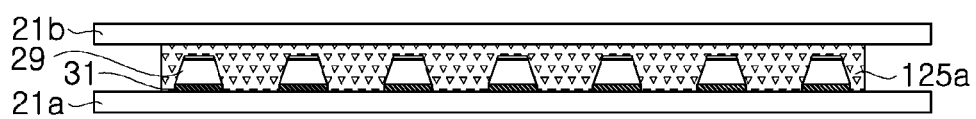
Figure 6G:
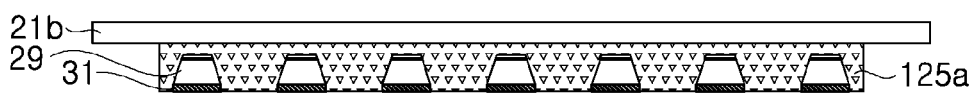

Referring to FIG. 6E, after removal of the p-type electrodes 33, the plurality of light emitting diodes 112 is covered with a filler 125a. Then, as shown in FIG. 6F, a second manufacturing substrate 21b is bonded to an upper side of the filler 125a. After bonding of the second manufacturing substrate 21b, the first manufacturing substrate 21a is removed, as shown in FIG. 6G.

Figure 7A:
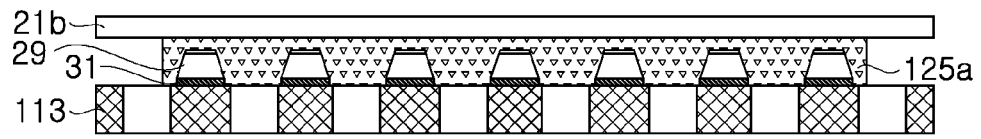
FIG. 7A, FIG. 7B, FIG. 7C, FIG. 7D, FIG. 7E, and FIG. 7F are sectional views illustrating a process of manufacturing a light emitting part of the display apparatus according to the second exemplary embodiment.

Then, as shown in FIG. 7A, a connection substrate 113 is brought into contact with and coupled to the semiconductor structure from which the first manufacturing substrate 21a is removed. Here, a bonding agent may be applied to a portion of an upper surface of the connection substrate 113, particularly, to some conductive portions 113a of the connection substrate 113.

Figure 7B:
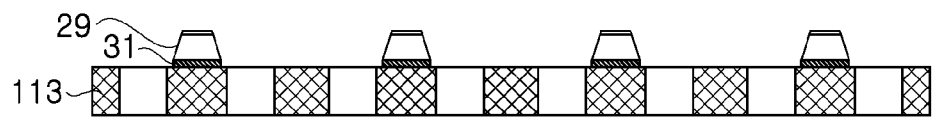
Figure 7C:
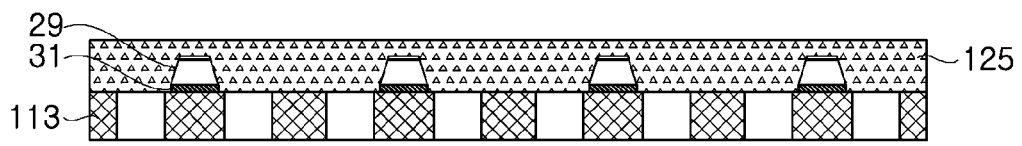

As a result, referring to FIG. 7B, the plurality of light emitting diodes 112 is coupled to the conductive portions 113a of the connection substrate 113, and an encapsulation material 125 is formed to cover the plurality of light emitting diodes 112 bonded to the connection substrate 113, as shown in FIG. 7C.

Figure 7D:
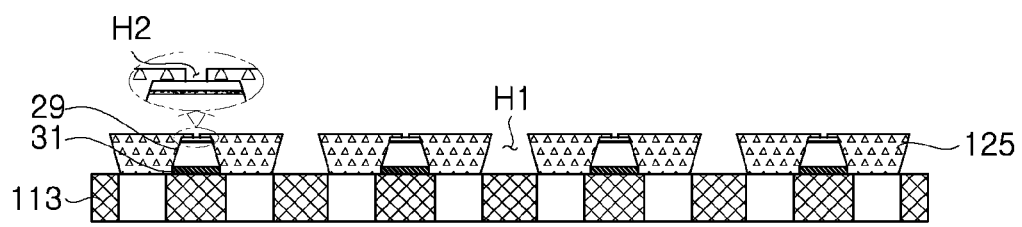

Next, as shown in FIG. 7D, first blind-holes H1 and second blind-holes H2 are formed by etching the encapsulation material 125. Here, the first blind-holes H1 are formed to expose the conductive portions 113a of the connection substrate 113 between the light emitting diodes 112 as in the first exemplary embodiment. The second blind-hole H2 is formed on each of the light emitting diodes 112 so as to expose a portion of the p-type semiconductor layer 27 of the light emitting diode 112. By way of example, when the p-type semiconductor layer 27 has a total area of 100 $\mu m^2$, the exposed portion of the p-type semiconductor layer 27 may have an area of larger than 0.1 $\mu m^2$ to 25 $\mu m^2$.

Figure 7E:
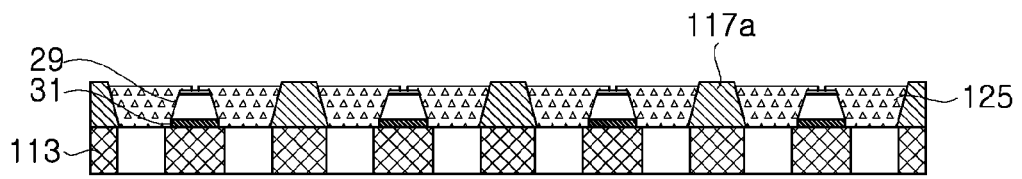

After formation of the first blind-holes H1 and the second blind-holes H2, reflective electrodes are formed on the first blind-holes H1, as shown in FIG. 7E. The reflective electrodes 117 are formed in the same way as the first exemplary embodiment and may have a greater height than the encapsulation material 125.

Figure 7F:
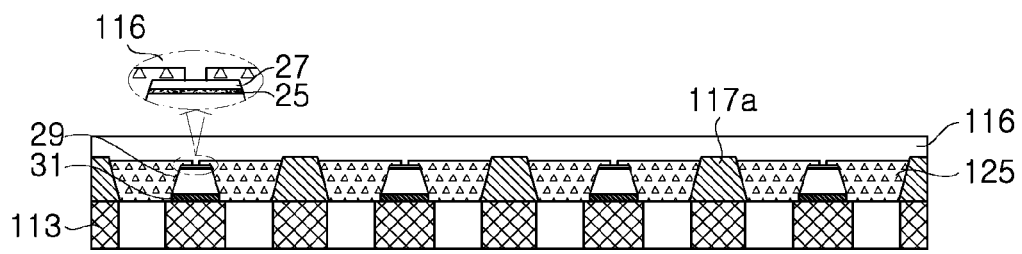

Then, as shown in FIG. 7F, a transparent electrode 116 is formed to cover the exposed portion of the p-type semiconductor layer 27, the encapsulation material 125 and the reflective electrodes 117. The transparent electrode 116 fills the second blind-holes H2 formed in the encapsulation material 125 to form electrical contact with the p-type semiconductor layer 27. The transparent electrode 116 may be formed by completely filling steps formed between the encapsulation material 125 and the reflective electrodes 117.

When the transparent electrode 116 is formed as described above, manufacture of the light emitting part 111 is completed. The process of coupling the light emitting part 111 to the TFT panel part 130 and the light conversion part 123 is the same as the first exemplary embodiment and detailed descriptions thereof will be omitted.

Figure 8:
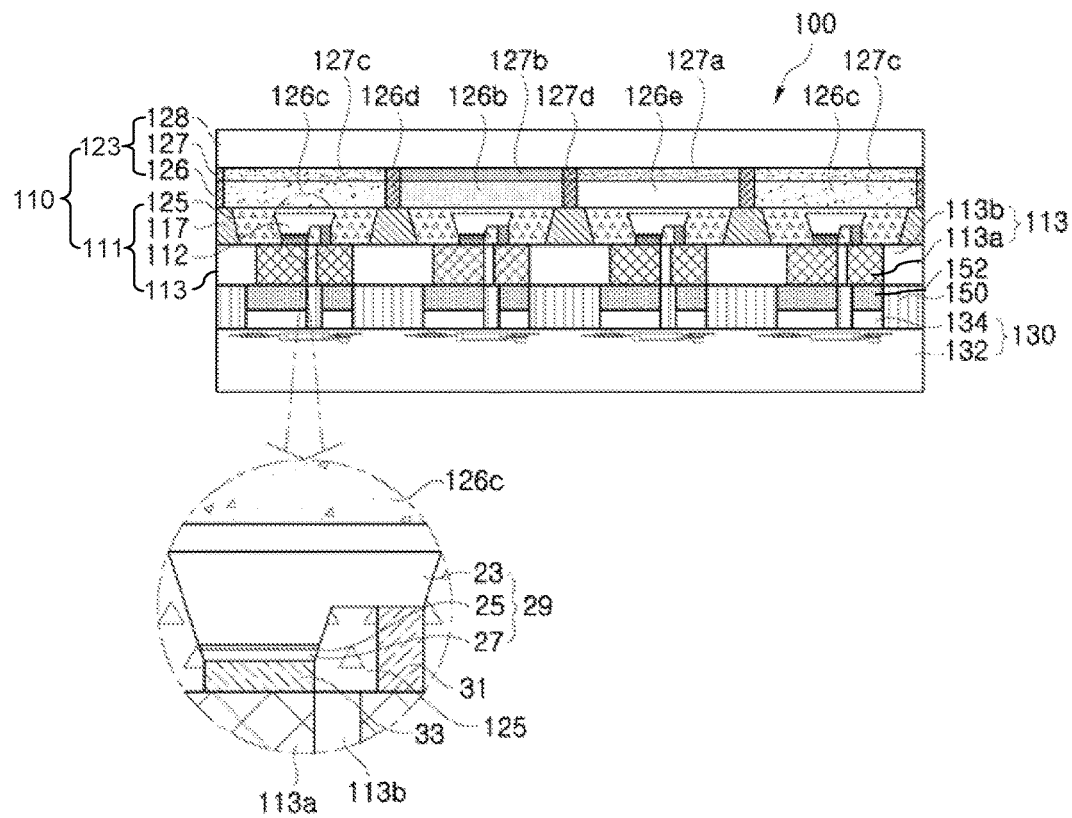
FIG. 8 is a sectional view of a display apparatus according to a third exemplary embodiment.

FIG. 8 is a sectional view of a display apparatus according to a third exemplary embodiment.

Referring to FIG. 8, the display apparatus 100 according to the third exemplary embodiment includes a light emitting diode part 110, a TFT panel part 130, and an anisotropic conductive film 150.

The light emitting diode part 110 includes a light emitting part 111 and a light conversion part 123. The light emitting part 111 includes light emitting diodes 112, a connection substrate 113, reflective electrodes 117, and an encapsulation material 125. The light conversion part 123 includes a phosphor layer 126, a color filter 127, and a protective substrate 128.

The light emitting part 111 includes a plurality of light emitting diodes 112, which are regularly arranged with reference to the connection substrate 113. In this exemplary embodiment, light emitting diodes 112 are flip-chip type light emitting diodes 112. That is, referring to FIG. 8, each of the light emitting diodes 112 includes an n-type semiconductor layer 23, an active layer 25, a p-type semiconductor layer 27, an n-type electrode 31, and a p-type electrode 33. The p-type electrode 33 electrically contacts the p-type semiconductor layer 27, and the n-type semiconductor layer 23 may be partially exposed by etching the p-type semiconductor layer 27 and the active layer 25 at one side of the p-type electrode 33. The n-type electrode 31 may be formed on the exposed portion of the n-type semiconductor layer 23. The n-type electrode 31 may be formed with a large thickness so as to be flush with the p-type electrode 33.

By forming the light emitting diodes 112 as described above, the p-type electrode 33 and the n-type electrode 31 of each of the light emitting diodes 112 can electrically contact a corresponding conductive portion 113a of the connection substrate 113.

As in the first exemplary embodiment, the connection substrate 113 according to this exemplary embodiment includes conductive portions 113a and insulating portions 113b, in which the distance between the conductive portions 113a may be different from that of the first exemplary embodiment. This is because the p-type electrode 33 and the n-type electrode 31 of each light emitting diode 112 electrically contact each of the conductive portions 113a of the connection substrate 113. In the exemplary embodiment of FIG. 8, a first set of conductive portions 113a contact the n-type electrode 31 and have a width that extends beyond a respective periphery of the n-type semiconductor layer 23 in at least one direction. Similarly, a second set of conductive portions 113a contact the p-type electrode 33 and have a width that extends beyond a respective periphery of both the p-type semiconductor layer 27 and the n-type semiconductor layer 23 in at least one direction.

As in the first and second exemplary embodiments, the encapsulation material 125 is disposed between the reflective electrodes 117 to cover the light emitting diodes 112, and may also be disposed between the n-type electrode 31 and the p-type electrode 33 to insulate the n-type electrode 31 from the p-type electrode 33.

In this exemplary embodiment, since both the n-type electrode 31 and the p-type electrode 33 electrically contact the conductive portion 113a of the connection substrate 113, the transparent electrode 116 may be omitted. That is, the encapsulation material 125 is formed to completely cover the light emitting diode 112. In addition, the reflective electrodes 117 disposed between the encapsulation materials 125 have the same height as the encapsulation materials 125. With this structure, the light conversion part 123 can be directly coupled to upper sides of the encapsulation material 125 and the reflective electrodes 117.

With the structure of the display apparatus 100 according to this exemplary embodiment manufactured as above, light emitted from each of the light emitting diodes 112 can be discharged through the upper and side surfaces of the light emitting diode 112. Light emitted from the light emitting diodes 112 can be directly discharged towards the light conversion part 123 or can be reflected by the reflective electrodes 117 or by the connection substrate 113 to be discharged towards the light conversion part 123.

Figure 9:
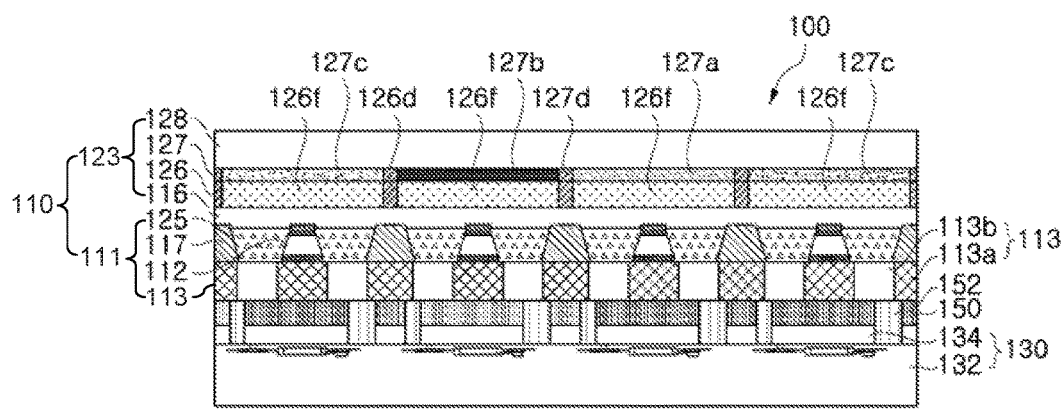
FIG. 9 is a sectional view of a display apparatus according to a fourth exemplary embodiment.

FIG. 9 is a sectional view of a display apparatus according to a fourth exemplary embodiment.

Referring to FIG. 9, the display apparatus 100 according to the fourth exemplary embodiment includes a light emitting diode part 110, a TFT panel part 130, and an anisotropic conductive film 150.

The light emitting diode part 110 includes a light emitting part 111 and a light conversion part 123. The light emitting part 111 includes light emitting diodes 112, a connection substrate 113, a transparent electrode 116, reflective electrodes 117, and an encapsulation material 125. The light conversion part 123 includes a phosphor layer 126, a color filter 127, and a protective substrate 128. In description of this exemplary embodiment, descriptions of the same components as in the first exemplary embodiment will be omitted.

In the light conversion part 123 according to this exemplary embodiment, the phosphor layer 126 includes a white phosphor layer 126f. The white phosphor layer 126f emits white light through wavelength conversion of light emitted from the light emitting diode 112. Thus, the components of the white phosphor layer 126f can be changed depending upon the kind of light emitted from the light emitting diodes 112.

White light emitted through the white phosphor layer 126f is converted into blue light, green light and red light while passing through the blue light portion 127a, the green light portion 127b and the red light portion 127c of the color filter 127 such that only blue light, green light and red light can be discharged to the outside.

Figure 10:
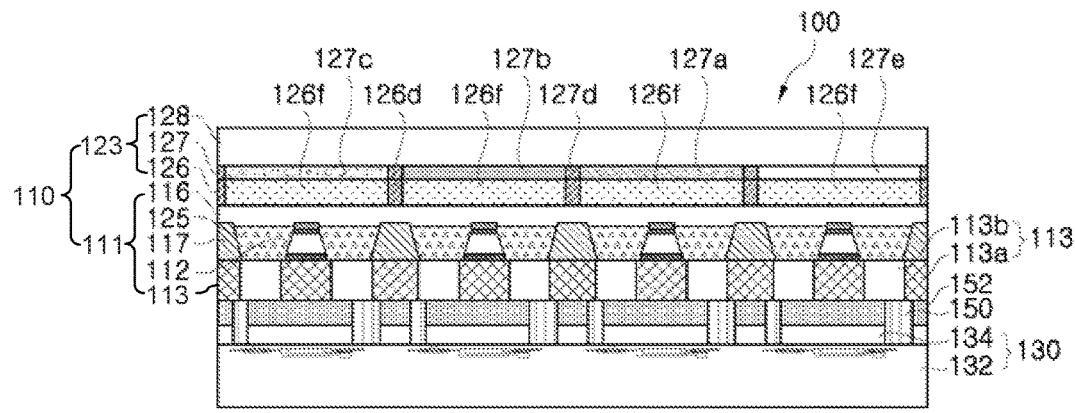
FIG. 10 is a sectional view of a display apparatus according to a fifth exemplary embodiment.

FIG. 10 is a sectional view of a display apparatus according to a fifth exemplary embodiment.

Referring to FIG. 10, the display apparatus 100 according to the fifth exemplary embodiment includes a light emitting diode part 110, a TFT panel part 130, and an anisotropic conductive film 150.

The light emitting diode part 110 includes a light emitting part 111 and a light conversion part 123. The light emitting part 111 includes light emitting diodes 112, a connection substrate 113, a transparent electrode 116, reflective electrodes 117, and an encapsulation material 125. The light conversion part 123 includes a phosphor layer 126, a color filter 127, and a protective substrate 128. In description of this exemplary embodiment, descriptions of the same components as the first and fourth exemplary embodiments will be omitted.

As in the fourth exemplary embodiment, the phosphor layer 126 of the light conversion part 123 according to the fifth exemplary embodiment includes a white phosphor layer 126f, and the color filter 127 includes a blue light portion 127a, a green light portion 127b, a red light portion 127c, and a transparent portion 127e. In this exemplary embodiment, each of the blue light portion 127a, the green light portion 127b, the red light portion 127c and the transparent portion 127e may constitute one subpixel and one pixel may be composed of four subpixels.

Accordingly, white light emitted through the phosphor layer 126 is converted into blue light, green light and red light while passing through the blue light portion 127a, the green light portion 127b and the red light portion 127c such that only blue light, green light and red light can be discharged to the outside, and white light passing through the transparent portion 127e can be discharged to the outside without wavelength conversion.

Figure 11:
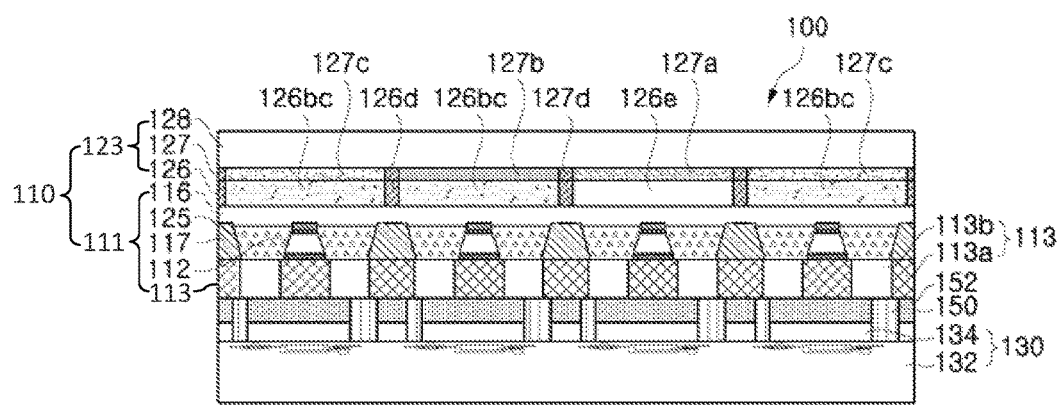
FIG. 11 is a sectional view of a display apparatus according to a sixth exemplary embodiment.

FIG. 11 is a sectional view of a display apparatus according to a sixth exemplary embodiment.

Referring to FIG. 11, the display apparatus 100 according to the sixth exemplary embodiment includes a light emitting diode part 110, a TFT panel part 130, and an anisotropic conductive film 150.

The light emitting diode part 110 includes a light emitting part 111 and a light conversion part 123. The light emitting part 111 includes light emitting diodes 112, a connection substrate 113, a transparent electrode 116, reflective electrodes 117, and an encapsulation material 125. The light conversion part 123 includes a phosphor layer 126, a color filter 127, and a protective substrate 128. In description of this exemplary embodiment, descriptions of the same components as the first exemplary embodiment will be omitted.

In the light conversion part 123 according to this exemplary embodiment, the phosphor layer 126 includes a red-green phosphor layer 126bc and a transparent layer 126e. The red-green phosphor layer 126bc includes green phosphors and red phosphors. Accordingly, the red-green phosphor layer 126bc emits a mixture of green light and red light through wavelength conversion of light emitted from the light emitting diode 112. In this exemplary embodiment, the light emitting diodes 112 are blue light emitting diodes and blue light emitted from the light emitting diode 112 is subjected to wavelength conversion while passing through the red-green phosphor layer 126bc such that green light and red light can be discharged at the same time.

Green light and red light emitted through the red-green phosphor layer 126bc can be discharged through the green light portion 127b and the red light portion of the color filter 127 such that only green light and red light can be discharged to the outside. That is, the red-green phosphor layer 126bc may be disposed at locations corresponding to the green light portion 127b and the red light portion 127c of the color filter 127.

Further, the transparent layer 126e of the phosphor layer 126 may be disposed at a location corresponding to the blue light portion 127a of the color filter 127.

Figure 12:
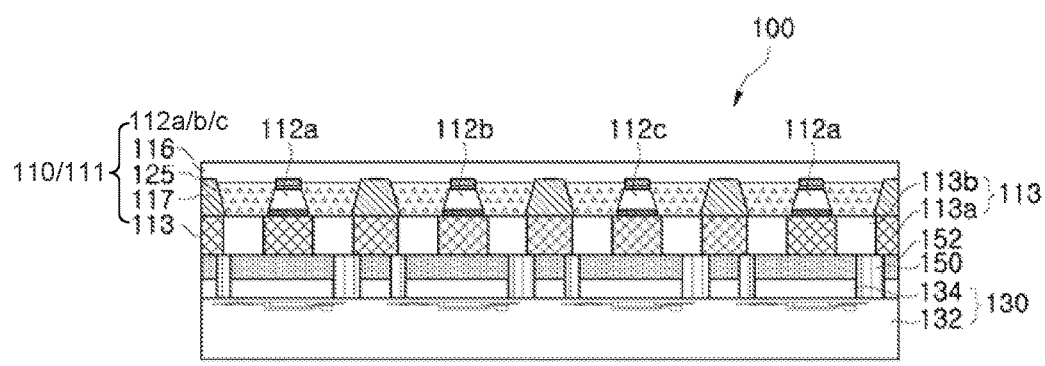
FIG. 12 is a sectional view of a display apparatus according to a seventh exemplary embodiment.

FIG. 12 is a sectional view of a display apparatus according to a seventh exemplary embodiment.

Referring to FIG. 12, the display apparatus 100 according to the seventh exemplary embodiment includes a light emitting diode part 110, a TFT panel part 130, and an anisotropic conductive film 150.

The light emitting diode part 110 includes the light emitting part 111, which includes blue light emitting diodes 112a, green light emitting diodes 112b, red light emitting diodes 112c, a connection substrate 113, a transparent electrode 116, reflective electrodes 117, and an encapsulation material 125. In description of this exemplary embodiment, descriptions of the same components as the first exemplary embodiment will be omitted.

Multiple blue light emitting diodes 112a, the green light emitting diodes 112b and the red light emitting diodes 112c are provided. Each of the blue light emitting diode 112a, the green light emitting diode 112b and the red light emitting diode 112c is regularly arranged on the connection substrate 113. In this exemplary embodiment, one blue light emitting diode 112a, one green light emitting diode 112b and one red light emitting diode 112c may be disposed adjacent to one another and these light emitting diodes 112a, 112b, 112c may be arranged at constant intervals in rows and columns to be separated from each other.

In this exemplary embodiment, one of the blue light emitting diode 112a, the green light emitting diode 112b, and the red light emitting diode 112c is provided to one subpixel. The blue light emitting diode 112a may emit light having a peak wavelength in the range of 430 nm to 470 nm and the green light emitting diode 112b may emit light having a peak wavelength in the range of 510 nm to 550 nm. The red light emitting diode 112c may emit light having a peak wavelength of 610 nm to 650 nm.

The encapsulation material 125 is disposed to surround the side surface of each of the blue light emitting diodes 112a, the green light emitting diodes 112b, and the red light emitting diodes 112c. For the same reason as for the provision of the encapsulation material 125 in the other exemplary embodiments, the encapsulation material 125 can prevent damage to each of the light emitting diodes 112a, 112b, 112c due to external environments and exhibits electrical insulating properties.

Accordingly, light emitted from the blue light emitting diodes 112a, the green light emitting diodes 112b and the red light emitting diodes 112c can be discharged to the outside through the encapsulation material 125 and the transparent electrode 116.

Unlike the other exemplary embodiments, the display apparatus 100 according to this exemplary embodiment may not include a separate light conversion part 123. Since blue light, green light, and red light can be emitted from the light emitting diodes 112a, 112b, 112c provided in one-to-one correspondence to subpixels, the display apparatus 100 can be driven by operation of the TFT panel part 130 without the separate light conversion part 123.

Although some exemplary embodiments have been described herein, it should be understood by those skilled in the art that these embodiments are given by way of illustration only, and that various modifications, variations, and alterations can be made without departing from the spirit and scope of the invention. Therefore, the scope of the present disclosure should be limited only by the accompanying claims and equivalents thereof.

What is claimed is:

1. A display apparatus, comprising:
   a light emitting part comprising a plurality of light emitting diodes; and
   a thin film transistor (TFT) panel part comprising a plurality of TFTs configured to drive the plurality of light emitting diodes,
   wherein a first side of the light emitting part and a first side of the TFT panel part are coupled to each other so as to face each other, and
   wherein the plurality of light emitting diodes are electrically connected to the plurality of TFTs, respectively,
   wherein each of the light emitting diodes comprises:
   a light emitting structure comprising a first conductivity type semiconductor layer, a second conductivity type semiconductor layer, and an active layer interposed between the first and second conductivity type semiconductor layers;
   a first electrode disposed on the first conductivity type semiconductor layer and electrically connected to the first conductivity type semiconductor layer;
   a second electrode disposed on the second conductivity type semiconductor layer and electrically connected to the second conductivity type semiconductor layer; and
   the second conductivity type semiconductor layer is disposed closer to the thin film transistor (TFT) panel part than the first conductivity type semiconductor layer, and
   wherein the light emitting part comprises:
   a connection substrate comprising a first set of conductive portions and a second set of conductive portions disposed between insulating portions and electrically insulated from each other; and
   an encapsulation material disposed to surround a top surface and side surfaces of the plurality of light emitting diodes,
   wherein the first set of conductive portions are electrically connected to the first electrodes and have a width that extends beyond a periphery of the first semiconductor in at least one direction, and the second set of conductive portions are electrically connected to the second electrodes and have a width that extends beyond a periphery of the first and second semiconductors in at least one direction.

2. The display apparatus according to claim 1, further comprising a light conversion part configured to convert light emitted from the light emitting part,
   wherein a second side of the light emitting part is coupled to one side of the light conversion part to face each other.

3. The display apparatus according to claim 2, wherein the plurality of light emitting diodes is configured to emit light in the near ultraviolet range or blue light, and the light conversion part is configured to emit at least one of blue light, green light, and red light through wavelength conversion of light emitted from the plurality of light emitting diodes.

4. The display apparatus according to claim 2, wherein the light conversion part comprises:
   a phosphor layer configured to convert wavelengths of light emitted from the plurality of light emitting diodes; and
   a color filter disposed on the phosphor layer and configured to block light emitted from the phosphor layer outside of a wavelength range.

5. The display apparatus according to claim 1, wherein the plurality of light emitting diodes comprise at least one of a blue light emitting diode configured to emit blue light, a green light emitting diode configured to emit green light, and a red light emitting diode configured to emit green light.

6. The display apparatus according to claim 1,
   wherein the plurality of TFTs is electrically connected to the plurality of light emitting diodes through the connection substrate.

7. The display apparatus according to claim 6, wherein the connection substrate is a flexible substrate.

8. The display apparatus according to claim 6, wherein:
   the insulating portions comprise at least one of polydimethylsiloxane (PDMS) and a polyimide; and
   the conductive portions comprise a metal.

\* \* \* \* \*

UNITED STATES PATENT AND TRADEMARK OFFICE
CERTIFICATE OF CORRECTION

PATENT NO. : 10,332,949 B2  
APPLICATION NO. : 15/642662  
DATED : June 25, 2019  
INVENTOR(S) : Motonobu Takeya, Jong Ik Lee and Young Hyun Kim Page 1 of 1

It is certified that error appears in the above-identified patent and that said Letters Patent is hereby corrected as shown below:

In the Claims

Change Claim 5 to read:
5. The display apparatus according to claim 1,
wherein the plurality of light emitting diodes comprise at least one of a blue light emitting diode configured to emit blue light, a green light emitting diode configured to emit green light, and a red light emitting diode configured to emit red light.

Signed and Sealed this  
Sixth Day of July, 2021

Drew Hirshfeld  
*Performing the Functions and Duties of the  
Under Secretary of Commerce for Intellectual Property and  
Director of the United States Patent and Trademark Office*